United States Patent
Motoyama et al.

(10) Patent No.: US 10,957,535 B2
(45) Date of Patent: Mar. 23, 2021

(54) SEMICONDUCTOR FILM FORMING METHOD AND FILM FORMING APPARATUS

(71) Applicant: TOKYO ELECTRON LIMITED, Tokyo (JP)

(72) Inventors: Yutaka Motoyama, Nirasaki (JP); Younggi Hong, Gyeonggi-do (KR)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 16/409,199

(22) Filed: May 10, 2019

(65) Prior Publication Data

US 2019/0348278 A1 Nov. 14, 2019

(30) Foreign Application Priority Data

May 11, 2018 (JP) .............................. JP2018-092516

(51) Int. Cl.
| | |
|---|---|
| *H01L 21/02* | (2006.01) |
| *H01L 21/306* | (2006.01) |
| *H01L 21/762* | (2006.01) |
| *C23C 16/52* | (2006.01) |
| *C23C 16/56* | (2006.01) |
| *C23C 16/24* | (2006.01) |
| *C23C 16/04* | (2006.01) |

(Continued)

(52) U.S. Cl.
CPC .......... *H01L 21/0262* (2013.01); *C23C 16/24* (2013.01); *C23C 16/52* (2013.01); *C23C 16/56* (2013.01); *H01L 21/02532* (2013.01); *H01L 21/3065* (2013.01)

(58) Field of Classification Search
CPC .................................................. H01L 21/0262
See application file for complete search history.

(56) References Cited

U.S. PATENT DOCUMENTS

| 2007/0196972 A1* | 8/2007 | Shima | ............. | H01L 21/823807 |
|---|---|---|---|---|
| | | | | 438/197 |
| 2008/0182382 A1* | 7/2008 | Ingle | ................... | H01L 21/3105 |
| | | | | 438/435 |

(Continued)

FOREIGN PATENT DOCUMENTS

| JP | 20124542 A | 1/2012 |
|---|---|---|
| JP | 2017183508 A | 10/2017 |

*Primary Examiner* — Omar F Mojaddedi
(74) *Attorney, Agent, or Firm* — Nath, Goldberg & Meyer; Jerald L. Meyer

(57) ABSTRACT

There is provided a method of forming a semiconductor film, including: a first process of supplying a first semiconductor raw material gas onto a substrate having recesses formed therein to form a first semiconductor film in each of the recesses, each of the recesses being covered with an insulating film; a second process of supplying a halogen-containing etching gas onto the substrate to etch the first semiconductor film while exposing a surface of the insulating film in an upper portion of an inner wall of each of the recesses and leaving the first semiconductor film formed on a bottom surface of each of the recesses; and a third process of simultaneously supplying a halogen-containing semiconductor gas and a semiconductor hydride gas onto the substrate to form a second semiconductor film on the first semiconductor film formed on the bottom surface of each of the recesses.

13 Claims, 6 Drawing Sheets

(51) Int. Cl.
*C23C 16/40* (2006.01)
*H01L 21/768* (2006.01)
*H01L 21/76* (2006.01)
*H01L 21/3065* (2006.01)

(56) References Cited

U.S. PATENT DOCUMENTS

| | | | | |
|---|---|---|---|---|
| 2009/0286381 | A1* | 11/2009 | van Schravendijk | H01L 21/76801 |
| | | | | 438/435 |
| 2010/0041207 | A1* | 2/2010 | Lee | C23C 16/045 |
| | | | | 438/435 |
| 2011/0287629 | A1* | 11/2011 | Kakimoto | C23C 16/045 |
| | | | | 438/652 |
| 2015/0037975 | A1* | 2/2015 | Komori | H01L 21/28556 |
| | | | | 438/657 |
| 2015/0368802 | A1* | 12/2015 | Yamada | H01L 21/0217 |
| | | | | 427/579 |
| 2017/0221709 | A1* | 8/2017 | Ueno | C30B 25/186 |

* cited by examiner

FIG. 6A incoming
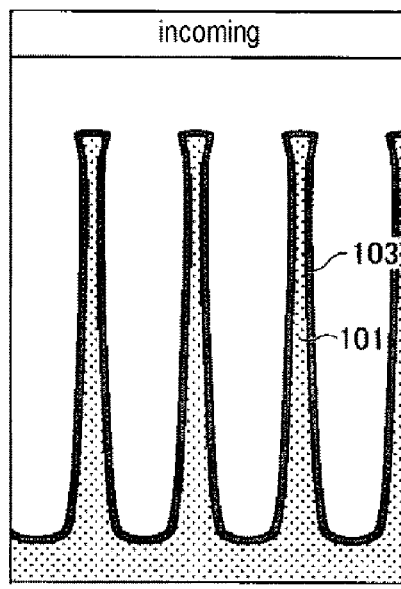
FIG. 6B 1st depo
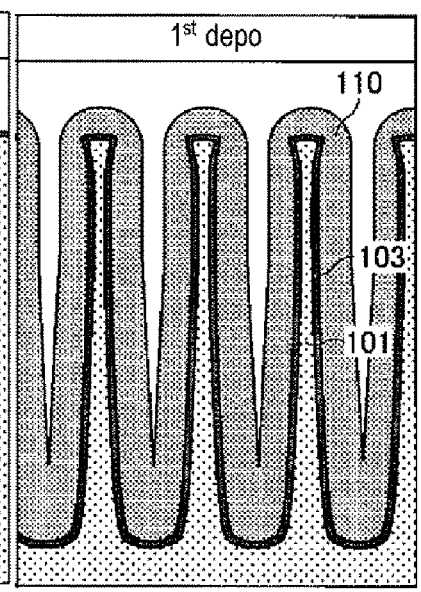
FIG. 6C 1st etch
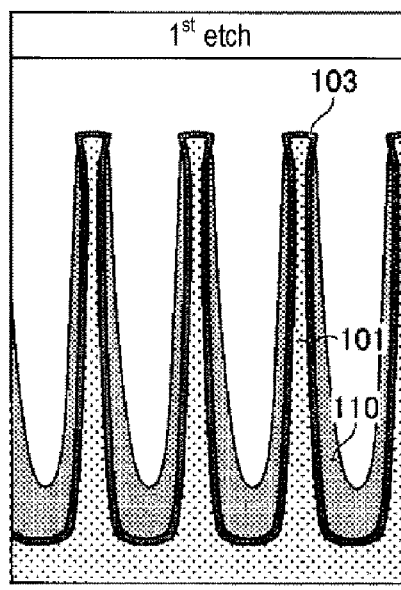
FIG. 6D 2nd depo
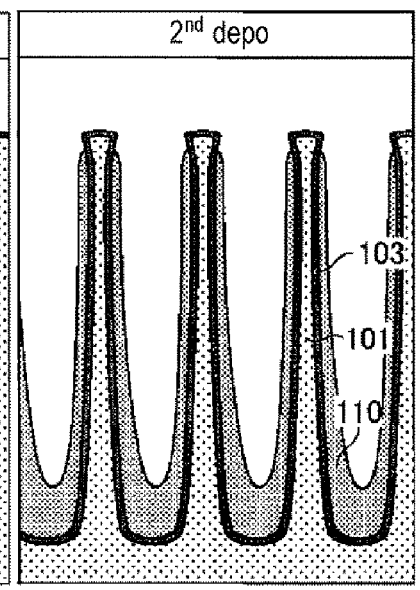

SEMICONDUCTOR FILM FORMING METHOD AND FILM FORMING APPARATUS

CROSS-REFERENCE TO RELATED APPLICATION

This application is based upon and claims the benefit of priority from Japanese Patent Application No. 2018-092516, filed on May 11, 2018, the entire contents of which are incorporated herein by reference.

TECHNICAL FIELD

The present disclosure relates to a semiconductor film forming method and a film forming apparatus.

BACKGROUND

There is known a technique for embedding a silicon film in a recess by alternately performing a film formation process and an etching process with respect to the recess such as a hole or trench in a repetitive manner.

SUMMARY

Some embodiments of the present disclosure provide a technique capable of forming a semiconductor film having good embedding property with high productivity.

According to one embodiment of the present disclosure, there is provided a method of forming a semiconductor film, including: a first process of supplying a first semiconductor raw material gas onto a substrate having recesses formed therein to form a first semiconductor film in each of the recesses, each of the recesses being covered with an insulating film; a second process of supplying a halogen-containing etching gas onto the substrate to etch the first semiconductor film while exposing a surface of the insulating film in an upper portion of an inner wall of each of the recesses and leaving the first semiconductor film formed on a bottom surface of each of the recesses; and a third process of simultaneously supplying a halogen-containing semiconductor gas and a semiconductor hydride gas onto the substrate to form a second semiconductor film on the first semiconductor film formed on the bottom surface of each of the recesses, the third process occurring after the second process.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

FIGS. 6A to 6H are views illustrating examples of results of film formation in the silicon film forming method.

DETAILED DESCRIPTION

Figures 1A, 1B, 1C, 1D, 1E, 1F, 1G:
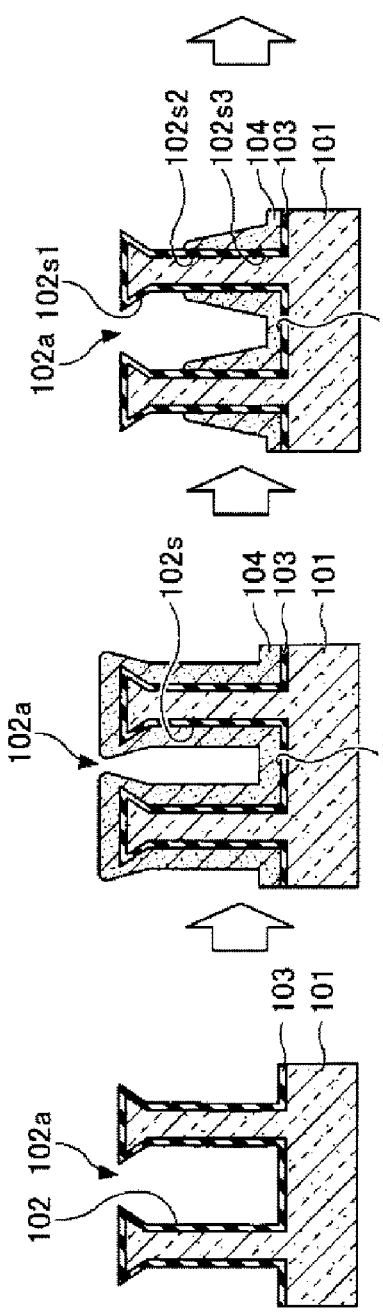
FIGS. 1A to 1G are cross-sectional process views illustrating an example of a silicon film forming method.

Hereinafter, non-limitative exemplary embodiments of the present disclosure will be described in detail with reference to the accompanying drawings. Like reference numerals in the drawings denote like elements, and a duplicate description thereof will be omitted. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

(Semiconductor Film Forming Method)

A semiconductor film forming method according to one embodiment of the present disclosure will be described by taking, as an example, the case of forming a silicon film. The silicon film forming method according to one embodiment is a method of forming a silicon film having good embedding property in a recess such as a hole or trench with good productivity by alternately performing a film forming process and an etching process with respect to the recess. The silicon film may be, for example, a non-doped film or a doped film. Examples of dopant of the doped film may include, for example, phosphorus (P), boron (B), arsenic (As), oxygen (O), and carbon (C). FIGS. 1A to 1G are cross-sectional process views illustrating an example of the silicon film forming method, each showing a cross section of each process of the silicon film forming method.

First, a substrate 101 having a recess 102 formed therein, which is covered with an insulating film 103, is installed (see FIG. 1A). The substrate 101 may be, for example, a semiconductor substrate such as a silicon substrate or the like. The insulating film 103 may be, for example, a silicon oxide film ($SiO_2$ film) or a silicon nitride film (SiN film). The recess 102 may be, for example, a trench or a hole.

Subsequently, a silicon raw material gas is supplied to the substrate 101 such that a first silicon film 104 is formed in the recess 102 (see FIG. 1B). In one embodiment, the first silicon film 104 is formed in the recess 102 in a conformal manner by supplying the silicon raw material gas to the substrate 101 while heating the substrate 101 by, for example, a chemical vapor deposition (CVD) method. The first silicon film 104 may be formed at such a thickness that, for example, the first silicon film 104 is formed on a bottom surface 102b and a sidewall 102s of the recess 102 and an upper opening 102a of the recess 102 is not blocked by the first silicon film 104. The silicon raw material gas may be a mixture of a halogen-containing silicon gas and a silane hydride gas from the viewpoint of forming a film having good step coverage and small surface roughness. A flow rate of the silane hydride gas may be set larger than that of the halogen-containing silicon gas. This makes it possible to reduce the etching property of the silicon film, which is attributable to halogen caused by the halogen-containing silicon gas and to form the first silicon film 104 on the surface of the insulating film 103 formed in the recess 102 at high speed. An example of the halogen-containing silicon gas may include a fluorine-containing silicon gas such as $SiF_4$, $SiHF_3$, $SiH_2F_2$, $SiH_3F$ or the like, a chlorine-containing silicon gas such as SiCl$_4$, SiHCl$_3$, SiH$_2$Cl$_2$ (DCS), SiH$_3$Cl or the like, or a bromine-containing gas such as SiBr$_4$, SiHBr$_3$, SiH$_2$Br$_2$, SiH$_3$Br or the like. An example of the silane hydride gas may include SiH$_4$, Si$_2$H$_6$, or Si$_3$H$_8$. The silicon raw material gas used to form the first silicon film 104 is not limited to the mixture of the halogen-containing silicon gas and the silane hydride gas. Alternatively, the first silicon film 104 may be formed by supplying the silane hydride gas alone as the silicon raw material gas. In some embodiments, a seed layer may be formed by supplying an aminosilane-based gas before the supply of the mixture of the halogen-containing silicon gas and the silane hydride gas, or the silane hydride gas. An example of the aminosilane-based gas may include diisopropylaminosilane (DIPAS), tris-dimethylaminosilane (3DMAS), or bis-tert-butylaminosilane (BTBAS).

Subsequently, a halogen-containing etching gas is supplied onto the substrate 101 to expose the surface of the insulating film 103 in an upper portion 102s1 of the inner wall of the recess 102, and to etch the first silicon film 104 at such a degree that the first silicon film 104 formed on the bottom surface 102b of the recess 102 remains (see FIG. 1C). Thus, the upper opening 102a of the recess 102 is widened. At this time, the surface of the insulating film 103 in a central portion 102s2 and a lower portion 102s3 of the inner wall of the recess 102 may be exposed or may not be exposed. In the example of FIG. 1C, the case where the surface of the insulating film 103 in the central portion 102s2 and the lower portion 102s3 of the inner wall of the recess 102 is not exposed is illustrated. An example of the halogen-containing etching gas may include Cl$_2$, HCl, F$_2$, Br$_2$, or HBr, or a mixture thereof.

Subsequently, a halogen-containing silicon gas and a silane hydride gas are simultaneously supplied onto the substrate 101 to form a second silicon film 105 on the first silicon film 104 remaining on the bottom surface 102b of the recess 102 (see FIG. 1D). In one embodiment, the second silicon film 105 is formed in the recess 102 in a conformal manner by simultaneously supplying the halogen-containing silicon gas and the silicon hydride gas while heating the substrate 101 by, for example, the CVD method. At this time, an incubation time of the second silicon film 105 to the first silicon film 104 is shorter than that of the second silicon film 105 to the insulating film 103. Thus, the second silicon film 105 is preferentially formed from the bottom surface 102b, the lower portion 102s3 and the central portion 102s2 of the inner wall of the recess 102. In other words, the second silicon film 105 grows from the side of the bottom surface 102b of the recess 102 toward the upper opening 102a in a bottom-up manner In some embodiments, a gas supply time period during which the second silicon film 105 is formed, namely a time period during which the halogen-containing silicon gas and the silane hydride gas are simultaneously supplied, may equal to or less than the incubation time of the second silicon film 105 to the insulating film 103. Therefore, the second silicon film 105 is not formed on the surface of the insulating film 103. This makes it possible to further suppress the upper opening 102a of the recess 102 from being blocked. A flow rate of the silane hydride gas may be larger than that of the halogen-containing silicon gas. This makes it possible to reduce the etching property of the silicon film, which is attributable to halogen caused by the halogen-containing silicon gas. Thus, the second silicon film 105 can be formed on the first silicon film 104 at high speed. An example of the halogen-containing silicon gas may include a fluorine-containing silicon gas such as SiF$_4$, SiHF$_3$, SiH$_2$F$_2$, SiH$_3$F or the like, a chlorine-containing silicon gas such as SiCl$_4$, SiHCl$_3$, SiH$_2$Cl$_2$, SiH$_3$Cl or the like, or a bromine-containing gas such as SiBr$_4$, SiHBr$_3$, SiH$_2$Br$_2$, SiH$_3$Br or the like. An example of the silane hydride gas may include SiH$_4$, Si$_2$H$_6$, or Si$_3$H$_8$.

Subsequently, the halogen-containing etching gas is supplied onto the substrate 101 to expose the surface of the insulating film 103 in the upper portion 102s1 of the inner wall of the recess 102, and to etch the second silicon film 105 at such a degree that the second silicon film 105 remains on the bottom surface 102b of the recess 102 (see FIG. 1E). At this time, since the exposed surface of the insulating film 103 is exposed to the halogen-containing etching gas, the incubation time shortened in the process of forming the second silicon film 105 is reset. In some embodiments, in a case where the surface of the insulating film 103 in the upper portion 102s1 of the inner wall of the recess 102 is already exposed, the halogen-containing etching gas may be supplied at such a degree that the incubation time of the surface of the insulating film 103 in the upper portion 102s1 of the inner wall of the recess 102 is reset.

Subsequently, the halogen-containing silicon gas and the silane hydride gas are simultaneously supplied onto the substrate 101 to form an additional silicon film 106 on the second silicon film 105 remaining on the bottom surface 102b of the recess 102 (see FIG. 1F). The method of forming the additional silicon film 106 may be similar to the method of forming the second silicon film 105.

Subsequently, the silicon raw material gas is supplied onto the substrate 101 to form a third silicon film 107 at such a degree that the recess 102 is buried (see FIG. 1G). In one embodiment, the third silicon film 107 may be formed so as to embed the recess 102 by supplying the silicon raw material gas while heating the substrate 101 by, for example, the CVD method. In some embodiments, the third silicon film 107 may be formed on the additional silicon film 106 by supplying the silane hydride gas alone as the silicon raw material gas. Therefore, the silicon film is not etched by the halogen caused by the halogen-containing silicon gas. This makes it possible to embed the third silicon film 107 in the recess 102 in a short period of time. The silicon raw material gas used to form the third silicon film 107 may be the mixture of the halogen-containing silicon gas and the silane hydride gas. The process of forming the third silicon film 107 may include a step of forming a seed layer by supplying an aminosilane-based gas, and a step of forming a silicon film on the seed layer by supplying a silicon raw material gas containing no amino group. In addition, a step of forming another silicon film on the seed layer by supplying a silane-based gas of a higher order than the silane-based gas used in the step of forming the silicon film, may be provided between the step of forming the seed layer and the step of forming the silicon film. Furthermore, a process of supplying a purge gas to substitute the respective gas may be provided between the respective steps. An example of the aminosilane-based gas may include DIPAS, 3DMAS, or BTBAS. An example of the silane-based gas may include the silane hydride gas described above.

As described above, the silicon film forming method according to one embodiment includes: a process of forming a silicon film in a recess by supplying a silicon raw material gas onto a substrate having the recess formed therein, which is covered with an insulating film; a process of etching the silicon film at such a degree that the silicon film remains on a bottom surface of the recess by supplying a halogen-containing etching gas onto the substrate to expose the surface of the insulating film in an upper portion of an inner wall of the recess; and a process of forming another silicon film on the silicon film remaining on a bottom surface of the recess by simultaneously supplying a halogen-containing silicon gas and a silane hydride gas. It is therefore possible to grow the silicon film from the side of the bottom surface of the recess toward an upper opening of the recess in a bottom-up manner. This makes it possible to form the silicon film having good embedding property with high productivity.

In the above embodiment, the cycle including the process of etching the second silicon film 105 and the process of forming the additional silicon film 106 has been described to be performed once, but the present disclosure is not limited thereto. For example, the cycle may be repeated multiple times. The number of times of the cycle may be determined, for example, according to a shape of the recess 102. For example, in a case where the shape of the recess 102 is complicated, namely when the upper opening 102a of the recess 102 is narrow or when the recess 102 has a barreled cross-sectional shape, the cycle may be repeated multiple times. This makes it possible to suppress gaps (voids) from being formed in the recess 102.

While in the above embodiment, the case where the silicon film is formed has been described, the present disclosure is not limited thereto. The method of the present disclosure may be applied to a case of forming, for example, a germanium film or a silicon germanium film. The germanium film and the silicon germanium film may be, for example, a non-doped film or a doped film.

In the case of forming the germanium film, for example, a germanium raw material gas may be used instead of the silicon raw material gas, and for example, a halogen-containing germanium gas may be used instead of the halogen-containing silicon gas. In addition, in the case of forming the germanium film, for example, a germane hydride gas may be used instead of the silane hydride gas, and for example, an aminogermane-based gas may be used instead of the aminosilane-based gas.

An example of the halogen-containing germanium gas may include a fluorine-containing germanium gas such as $GeF_4$, $GeHF_3$, $GeH_2F_2$, $GeH_3F$ or the like, a chlorine-containing germanium gas such as $GeCl_4$, $GeHCl_3$, $GeH_2Cl_2$, $GeH_3Cl$ or the like, or a bromine-containing germanium gas such as $GeBr_4$, $GeHBr_3$, $GeH_2Br_2$, $GeH_3Br$ or the like. An example of the germane hydride gas may include $GeH_4$, $Ge_2H_6$, or $Ge_3H_8$. An example of the aminogermane-based gas may include dimethylaminogermane (DMAG), diethylaminogermane (DEAG), bis-dimethyl-amino-germane (BDMAG), bis-diethylaminogermane (BDEAG), or tris-dimethylamino-germane (3DMAG).

In the case of forming the silicon germanium film, for example, both a silicon raw material gas and a germanium raw material gas may be used instead of the silicon raw material gas, and for example, both a halogen-containing silicon gas and a halogen-containing germanium gas may be used instead of the halogen-containing silicon gas. Further, in the case of forming the silicon germanium film, for example, both a silane hydride gas and a germane hydride gas may be used instead of the silane hydride gas, and for example, both an aminosilane-based gas and an aminogermane-based gas may be used instead of the aminosilane-based gas.

(Vertical Heat Treatment Apparatus)

A film forming apparatus capable of implementing the semiconductor film forming method described above will be described by taking, as an example, a batch-type vertical heat treatment apparatus that performs a heat treatment on a plurality of substrates in a collective manner. However, the film forming apparatus is not limited to the vertical heat treatment apparatus but may be various kinds of apparatuses. For example, the film forming apparatus may be a single-wafer-type apparatus that processes substrates one by one. Furthermore, for example, the film forming apparatus may be a semi-batch-type apparatus that revolves a plurality of substrates mounted on a rotary table inside a process container through the use of the rotary table such that the substrates sequentially pass through a region to which a raw material gas is supplied and a region to which a reaction gas reacting with the raw material gas is supplied, thus forming a film on each of the substrates.

Figure 2:
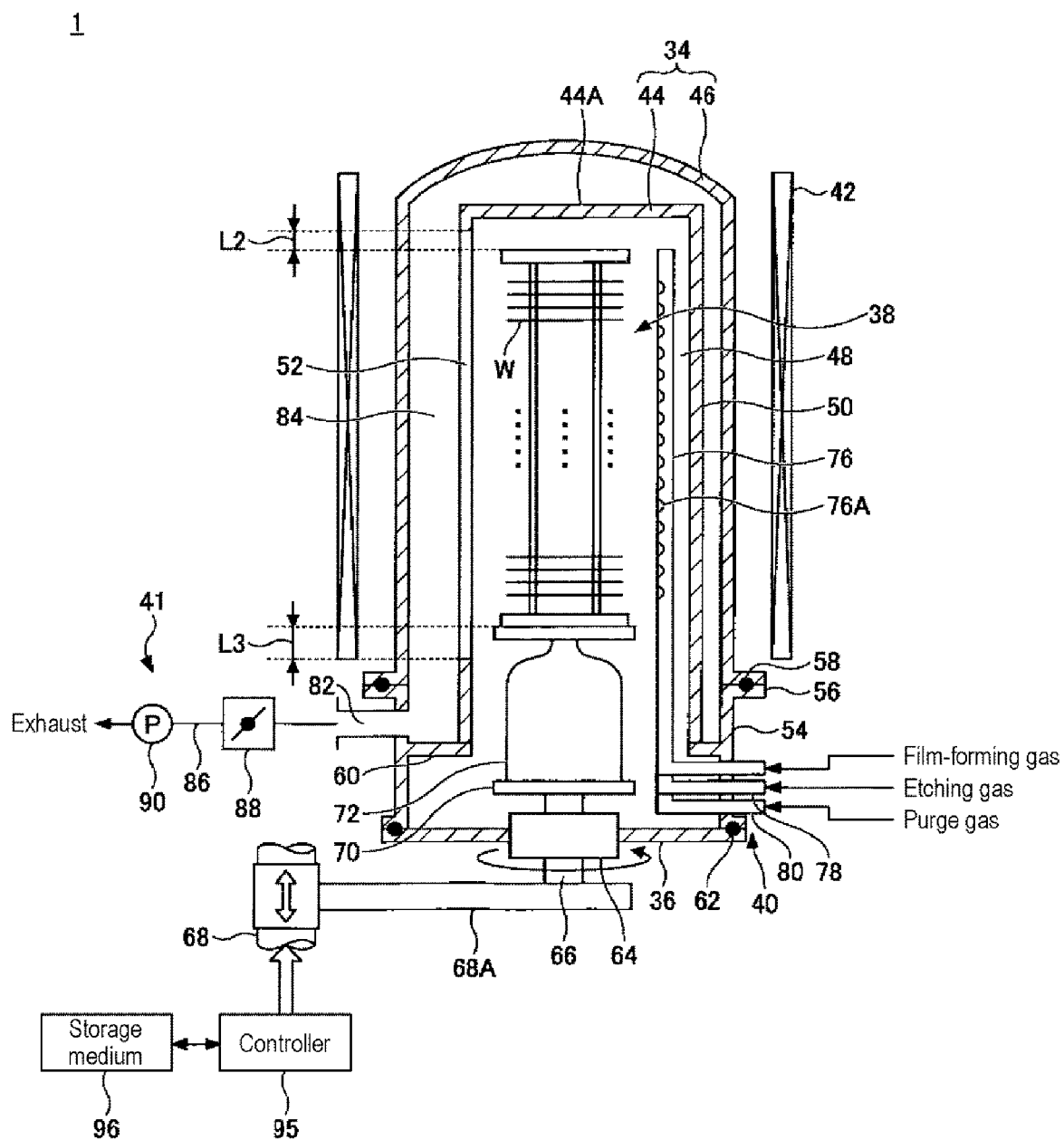
FIG. 2 is a vertical cross-sectional view illustrating an exemplary configuration of a vertical heat treatment apparatus.
Figure 3:
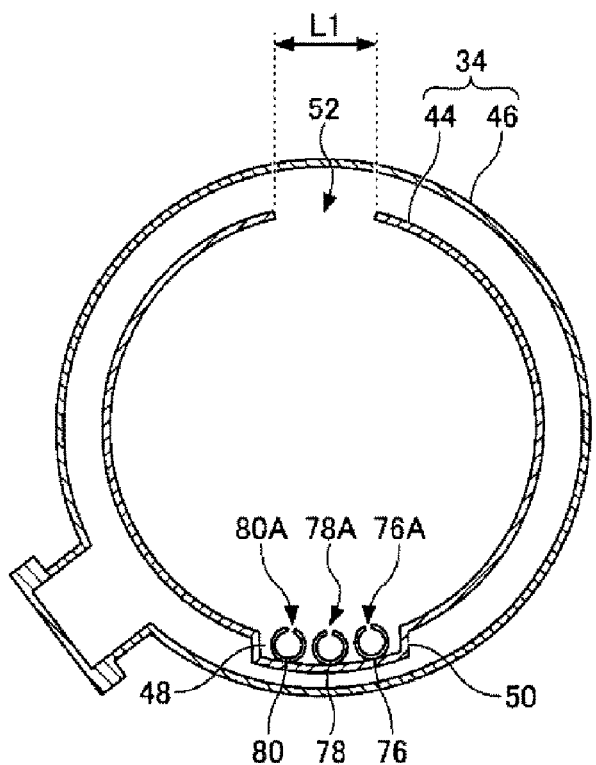
FIG. 3 is a transversal cross-sectional view illustrating an exemplary configuration of the vertical heat treatment apparatus.

FIG. 2 is a vertical cross-sectional view illustrating an exemplary configuration of the vertical heat treatment apparatus. FIG. 3 is a transversal cross-sectional view illustrating the exemplary configuration of the vertical heat treatment apparatus.

As illustrated in FIG. 2, a vertical heat treatment apparatus 1 includes a process container 34 that accommodates semiconductor wafers (hereinafter, referred to as "wafers W") as substrates, a lid 36 configured to airtightly close a lower end opening of the process container 34, a wafer boat 38 serving as a substrate holder that is accommodated in the process container 34 and configured to hold the plurality of wafers W at predetermined intervals, a gas supply part 40 configured to supply a gas into the process container 34, an exhaust part 41 configured to exhaust the gas from the process container 34, and a heating part 42 configured to heat the wafers W.

The process container 34 includes a cylindrical inner pipe 44 having a ceiling with its lower end opened, and a cylindrical outer pipe 46 having a ceiling with its lower end opened to cover the outer side of the inner pipe 44. The inner pipe 44 and the outer pipe 46 are made of a heat resistant material such as quartz or the like, and are arranged in a coaxial relationship with each other to have a double pipe structure.

A ceiling 44A of the inner pipe 44 is, for example, flat. A nozzle reception portion 48 in which a gas supply pipe is received is formed at one side of the inner pipe 44 along a longitudinal direction (vertical direction) of the inner pipe 44. For example, as illustrated in FIG. 3, a portion of the sidewall of the inner pipe 44 is protruded outward to form a convex portion 50. The interior of the convex portion 50 is used as the nozzle reception portion 48. A rectangular opening 52 having a width L1 is formed at a position facing the nozzle reception portion 48 in the sidewall of the inner pipe 44 along the longitudinal direction (vertical direction) of the inner pipe 44.

The opening 52 is a gas exhaust port formed to exhaust the gas from the inner pipe 44. The opening 52 is formed to extend in the vertical direction so that a vertical length of the opening 52 is equal to or longer than that of the wafer boat 38. That is to say, an upper end of the opening 52 is positioned equal to or higher than an upper end of the wafer boat 38, and a lower end of the opening 52 is positioned equal to or lower than a lower end of the wafer boat 38. Specifically, as illustrated in FIG. 2, a distance L2 in the height direction between the upper end of the wafer boat 38 and the upper end of the opening 52 falls within a range of about 0 to 5 mm. Furthermore, a distance L3 in the height direction between the lower end of the wafer boat 38 and the lower end of the opening 52 falls within a range of about 0 to 350 mm.

A lower end of the process container 34 is supported by a cylindrical manifold 54 made of, for example, stainless steel. A flange portion 56 is formed at an upper end of the manifold 54. A lower end of the outer pipe 46 is supported on the flange portion 56. A seal member 58 such as an O-ring is interposed between the upper end of the flange portion 56 and the lower end of the outer pipe 46 to make the interior of the outer pipe 46 airtight.

An annular support portion 60 is formed on an upper inner wall of the manifold 54. A lower end of the inner pipe 44 is supported on the support portion 60. The lid 36 is airtightly installed on a lower end opening of the manifold 54 through a seal member 62 such as an O-ring so that the lower end opening of the process container 34, namely the opening of the manifold 54, is airtightly closed. The lid 36 is made of, for example, stainless steel.

A rotary shaft 66 is installed in the central portion of the lid 36 so as to penetrate through a magnetic fluid seal portion 64. A lower portion of the rotary shaft 66 is rotatably supported by an arm 68A of an elevating part 68 including a boat elevator.

A rotary plate 70 is installed on an upper end of the rotary shaft 66. The wafer boat 38 that holds the wafers W is mounted on the rotary plate 70 via a heat-insulating tube 72 made of quartz. Thus, the lid 36 and the wafer boat 38 move up and down as a unit with the up-down movement operation of the elevating part 68, which makes it possible to insert or remove the wafer boat 38 into or from the process container 34.

The gas supply part 40 is installed in the manifold 54 to supply a gas such as a film-forming gas, an etching gas, a purge gas or the like into the inner pipe 44. The gas supply part 40 includes a plurality of (e.g., three) gas supply pipes 76, 78, and 80 made of quartz. Each of the gas supply pipes 76, 78, and 80 extends inside the inner pipe 44 along a longitudinal direction of the inner pipe 44. A base end of each of the gas supply pipes 76, 78, and 80 is bent in an L-formation so as to penetrate the manifold 54 so that they are supported by the manifold 54.

As illustrated in FIG. 3, the gas supply pipes 76, 78, and 80 are installed in the nozzle reception portion 48 of the inner pipe 44 in a line along the circumferential direction. A plurality of gas holes 76A, 78A, and 80A are respectively formed in the gas supply pipes 76, 78, and 80 at predetermined intervals along the longitudinal direction, so that gases can be discharged horizontally from the respective gas holes 76A, 78A, and 80A. For example, the predetermined intervals may be set equal to those of the wafers W held by the wafer boat 38. Furthermore, the height position of each of the gas holes 76A, 78A, and 80A is set so that each hole is located toward the middle between the wafers W adjacent to each other in the vertical direction. This makes it possible to efficiently supply each gas toward a space of the middle between the adjacent wafers W. The type of the gas includes a film-forming gas, an etching gas, and a purge gas. These gases can be supplied through the respective gas supply pipes 76, 78, and 80 as needed with their flow rates being controlled.

A gas outlet 82 is formed above the support portion 60 in an upper sidewall of the manifold 54. The gas in the inner pipe 44, which is discharged from the opening 52 through a space 84 between the inner pipe 44 and the outer pipe 46, can be exhausted through the gas outlet 82. The exhaust part 41 is installed in the gas outlet 82. The exhaust part 41 includes an exhaust passage 86 connected to the gas outlet 82. A pressure regulation valve 88 and a vacuum pump 90 are sequentially installed in the exhaust passage 86 to evacuate the interior of the process container 34.

The heating part 42 of a cylindrical shape is installed at the side of an outer periphery of the outer pipe 46 so as to surround the outer pipe 46. The heating part 42 heats the wafers W accommodated in the process container 34.

The entire operation of the vertical heat treatment apparatus 1 is controlled by a controller 95 such as, e.g., a computer. Furthermore, a program of the computer that controls the entire operation of the vertical heat treatment apparatus 1 is stored in a storage medium 96. The storage medium 96 may be, for example, a flexible disk, a compact disc, a hard disk, a flash memory, a DVD, or the like.

An example of a method of performing a predetermined heat treatment (for example, film formation) on the wafers W using the vertical heat treatment apparatus 1 configured as above will be described. First, the wafer boat 38 that holds the plurality of wafers W is loaded into the process container 34 by the elevating part 68. The lower end opening of the process container 34 is airtightly closed and sealed by the lid 36. Subsequently, evacuation is performed by the exhaust part 41 so that the interior of the process container 34 has a predetermined pressure. A film-forming gas is supplied from the gas supply pipe 76. The wafers W accommodated in the process container 34 are heated by the heating part 42. The heat treatment is performed while rotating the wafer boat 38. In this way, a film is formed on each wafer W.

(Example)

An example conducted to confirm the effects obtained by the semiconductor film forming method according to one embodiment will be described. In this example, a silicon film, which is an example of the semiconductor film, was formed by the vertical heat treatment apparatus 1 described above.

Figure 4:
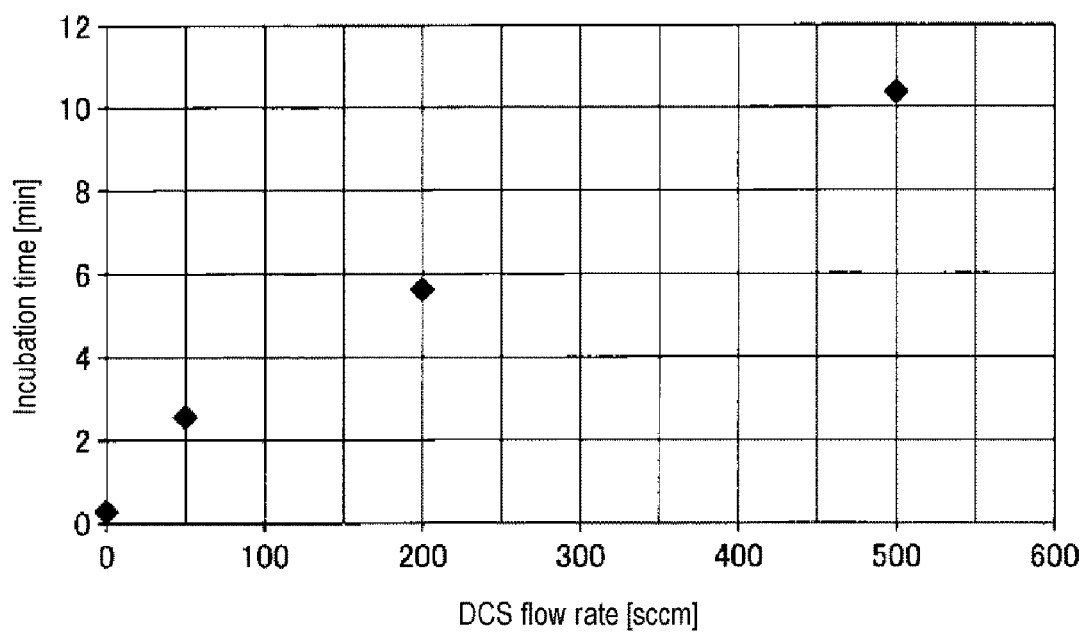
FIG. 4 is a diagram illustrating a relationship between a DCS flow rate and an incubation time.

FIG. 4 is a diagram illustrating a relationship between a DCS flow rate and an incubation time. In FIG. 4, the horizontal axis indicates the DCS flow rate (sccm) and the vertical axis indicates an incubation time (min) of a silicon film to a silicon oxide film. An example of the incubation time when the DCS flow rate is controlled to 0 sccm, 50 sccm, 200 sccm, and 500 sccm under the following process conditions is illustrated in FIG. 4. The process conditions are as follows.

<Process Conditions>

Wafer temperature: 530 degrees C.

Pressure: 0.45 Torr (60 Pa)

Gas: mixed gas of $SiH_4$ (1,500 sccm) and DCS

As illustrated in FIG. 4, it can be seen that the incubation time is varied depending on a magnitude of the DCS flow rate. That is to say, the incubation time becomes longer by additionally supplying DCS in addition to $SiH_4$. The larger the DCS flow rate, the longer the incubation time. Thus, it is understood that the incubation time can be controlled by controlling the ratio of DCS to $SiH_4$ in flow rate. As the incubation time becomes longer, an amount of the bottom-up growth can be increased. Thus, in the case of embedding the recess by repeatedly performing the cycle of the etching process and the film forming process as illustrated in FIGS. 1A to 1G, it is possible to reduce the number of repetitions of the cycle. As a result, it is possible to form a silicon film having good embedding property with enhanced productivity.

Figure 5:
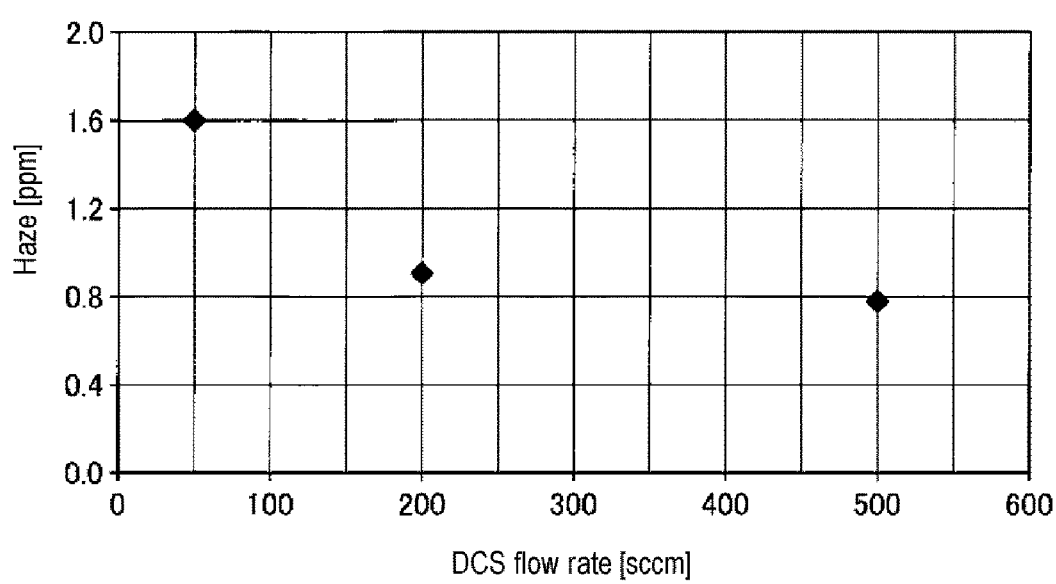
FIG. 5 is a diagram illustrating a relationship between a DCS flow rate and a Haze.

FIG. 5 is a diagram illustrating a relationship between a DCS flow rate and Haze. In FIG. 5, the horizontal axis indicates the DCS flow rate (sccm) and the vertical axis indicates Haze (ppm). The term "Haze" refers to a ratio of a diffuse transmittance Td to a total light transmittance Tt, which is represented by Td/Tt. An example of the Haze when the DCS flow rate is controlled to 50 sccm, 200 sccm, and 500 sccm under the following process conditions is illustrated in FIG. 5. The process conditions are as follows.

<Process Conditions>
Wafer temperature: 530 degrees C.
Pressure: 0.45 Torr (60 Pa)
Gas: mixed gas of SiH$_4$ (1,500 sccm) and DCS As illustrated in FIG. 5, it can be seen that the Haze is varied depending on a magnitude of the DCS flow rate. That is to say, it can be seen that, the case where the DCS flow rate is 200 sccm and 500 sccm, the Haze is reduced to a nearly halved level and the surface roughness is small, compared with the case where the DCS flow rate is 50 sccm. Therefore, from the viewpoint of forming a silicon film having small surface roughness, it is understood that the ratio of DCS to SiH$_4$ in flow rate is preferably 0.13 (200 sccm/1,500 sccm) or more, more preferably 0.33 (500 sccm/1,500 sccm) or more.

FIGS. 6A to 6H are views illustrating examples of results of film formation (deposition) in the silicon film forming method. In FIGS. 6A to 6H, there are illustrated observation results of the cross sections obtained when alternately performing a process of forming a silicon film 110 and a process of etching the silicon film 110 with respect to a substrate 101 having recesses formed therein, which are covered with an insulating film 103, seven times, and forming the silicon film 110 at such a degree that the recesses are fully embedded with the silicon film 110 after a seventh round of etching is performed. A silicon substrate was used as the substrate 101 and a silicon oxide film was used as the insulating film 103. The silicon film 110 was formed so as to be embedded in trenches which are examples of the recesses under the following process conditions.

<First Round of Silicon Film Formation (Including Two Steps)>
First Step
Gas: DIPAS (160 to 240 sccm)
Substrate temperature: 300 to 460 degrees C.
Pressure: 0.8 to 1.2 Torr (107 to 160 Pa)
Second Step
Gas: SiH$_4$/SiH$_2$Cl$_2$
(SiH$_4$: 1,200 to 1,800 sccm, SiH$_2$Cl$_2$: 400 to 600 sccm)
Substrate temperature: 380 to 560 degrees C.
Pressure: 2.4 to 3.6 Torr (320 to 480 Pa)
<First Round of Etching>
Gas: Cl$_2$ (1,600 to 2,400 sccm)
Substrate temperature: 300 to 450 degrees C.
Pressure: 0.16 to 0.24 Torr (21 to 32 Pa)
<Second Round of Silicon Film Formation>
Gas: SiH$_4$/SiH$_2$Cl$_2$
(SiH$_4$: 1,200 to 1,800 sccm, SiH$_2$Cl$_2$: 400 to 600 sccm)
Substrate temperature: 380 to 560 degrees C.
Pressure: 2.4 to 3.6 Torr (320 to 480 Pa)
<Second Round of Etching>
Gas: Cl$_2$ (1,600 to 2,400 sccm)
Substrate temperature: 300 to 450 degrees C.
Pressure: 0.16 to 0.24 Torr (21 to 32 Pa)
<N-Round of Silicon Film Formation (Where N is an Integer of 3 or More)>
Conditions similar to the second round of silicon film formation
<N-Round of Etching (Where N is an Integer of 3 or More)>
Conditions similar to the second round of etching
<Embedding of Silicon Film (Including Three Steps)>
First Step
Gas: DIPAS (160 to 240 sccm)
Substrate temperature: 300 to 460 degrees C.
Pressure: 0.8 to 1.2 Torr (107 to 160 Pa)
Second Step
Gas: Si$_2$H$_6$ (280 to 420 sccm)
Substrate temperature: 300 to 460 degrees C.
Pressure: 0.8 to 1.2 Torr (107 to 160 Pa)
Third Step
Gas: SiH$_4$ (1,200 to 1,800 sccm)
Substrate temperature: 420 to 640 degrees C.
Pressure: 0.36 to 0.54 Torr (48 to 72 Pa)

Figure 6E:
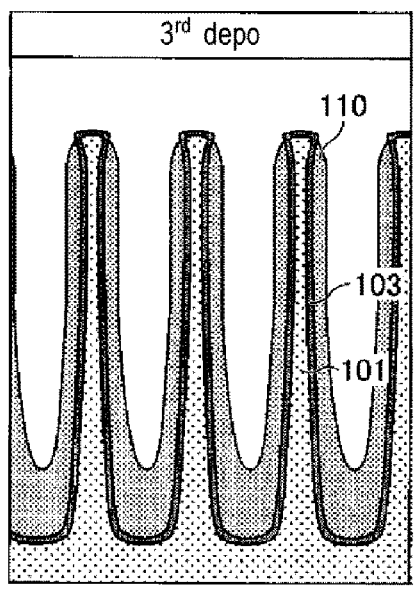

FIG. 6A illustrates an observation result of the cross section of the substrate 101 in which the recesses are covered with the insulating film 103. FIG. 6B illustrates an observation result of the cross section after a first round of film formation of the silicon film 110 is performed. FIG. 6C illustrates an observation result of the cross section after etching the silicon film 110 in the first round of film formation. FIGS. 6D, 6E, 6F, and 6G respectively illustrate observation results of the cross sections after second, third, fifth, and seventh round of film formations of the silicon film 110 are performed. FIG. 6H illustrates an observation result of the cross section after the recesses are fully embedded with the silicon film 110.

As illustrated in FIG. 6A, it can be seen that the recesses having a barreled cross-sectional shape is formed on the substrate 101, and the insulating film 103 is formed in a conformal manner on the front surface of the substrate 101 having the recesses formed therein.

As illustrated in FIG. 6B, it can be seen that the silicon film 110 is formed with good step coverage in conformity with the shape of the recesses by performing the first round of film formation of the silicon film 110. In addition, it can be seen that the silicon film 110 is formed at such a thickness that the upper opening of each recess is not blocked.

As illustrated in FIG. 6C, it can be seen that, by performing the first round of etching on the silicon film, the surface of the insulating film 103 in the upper portion of the inner wall of each recess is exposed, and the silicon film 110 remains on the bottom surface of each recess.

As illustrated in FIG. 6D, it can be seen that, by performing the second round of silicon film formation, the silicon film 110 is preferentially formed from the bottom surface, the lower portion of the inner wall, and the central portion of the inner wall of each recess.

Figure 6F:
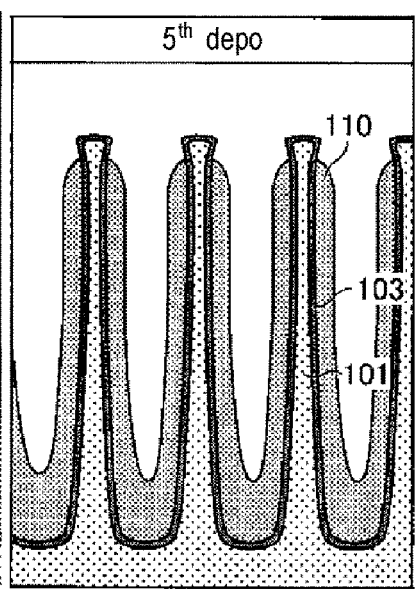
Figure 6G:
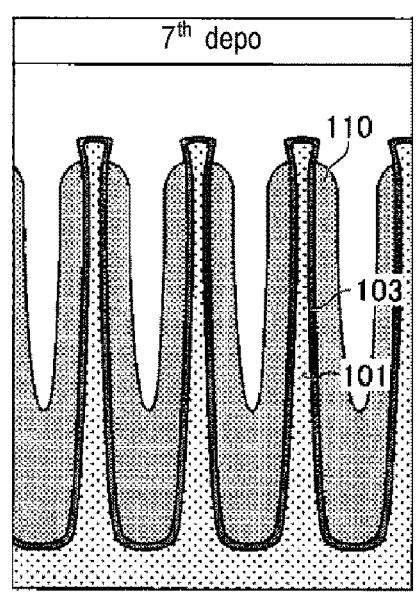
Figure 6H:
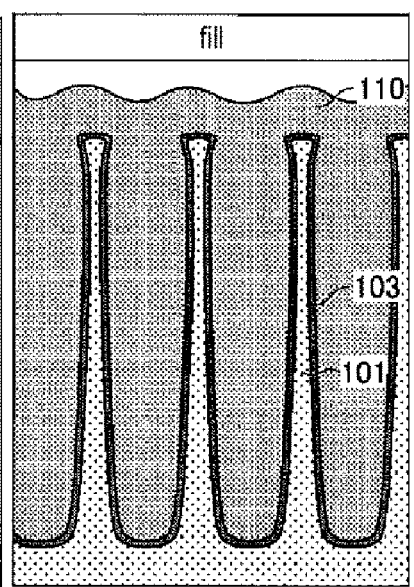

As illustrated in FIGS. 6E to 6G, it can be seen that, by performing the third, fifth, and seventh rounds of the silicon film formation, the silicon film 110 is preferentially formed from the bottom surface, the lower portion of the inner wall, and the central portion of the inner wall of each recess, and the silicon film 110 grows from the side of the bottom surface of each recess toward the upped opening in a bottom-up manner.

As illustrated in FIG. 6H, it can be seen that the silicon film 110 is fully embedded in each recess without generating voids by further embedding additional silicon film in each recess. That is to say, the silicon film having good embedding property was formed.

Furthermore, in the aforementioned embodiment, the silicon film, the germanium film, and the silicon germanium film are examples of the semiconductor film. The silicon raw material gas and the germanium raw material gas are examples of the semiconductor raw material gas. The halogen-containing silicon gas and the halogen-containing germanium gas are examples of the halogen-containing semiconductor gas. The silane hydride gas and the germane hydride gas are examples of the semiconductor hydride gas. The aminosilane-based gas and the amino-based germane gas are examples of the semiconductor raw material gas having an amino group.

According to the present disclosure in some embodiments, it is possible to form a semiconductor film with good embedding property with high productivity.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A method of forming a semiconductor film, comprising:
a first process of supplying a first semiconductor raw material gas onto a substrate having recesses formed therein to form a first semiconductor film in each of the recesses, each of the recesses being covered with an insulating film;
a second process of supplying a halogen-containing etching gas onto the substrate to etch the first semiconductor film while exposing a surface of the insulating film in an upper portion of an inner wall of each of the recesses and leaving the first semiconductor film formed on a bottom surface of each of the recesses; and
a third process of simultaneously supplying a halogen-containing semiconductor gas and a semiconductor hydride gas onto the substrate to form a second semiconductor film on the first semiconductor film formed on the bottom surface of each of the recesses, the third process occurring after the second process,
wherein, in the third process, a supply time of the halogen-containing semiconductor gas and the semiconductor hydride gas is equal to or less than an incubation time of the second semiconductor film with respect to the insulating film.

2. The method of claim 1, wherein the first process includes simultaneously supplying the halogen-containing semiconductor gas and the semiconductor hydride gas as the first semiconductor raw material gas onto the substrate.

3. The method of claim 1, further comprising: before supplying the first semiconductor raw material gas onto the substrate, supplying a third semiconductor raw material gas having an amino group onto the substrate to form a seed layer.

4. The method of claim 1, wherein the second process and the third process are repeated multiple times.

5. The method of claim 1, wherein, in the third process, a flow rate of the semiconductor hydride gas is larger than a flow rate of the halogen-containing semiconductor gas.

6. The method of claim 1, further comprising: a fourth process of supplying a second semiconductor raw material gas onto the substrate to form a third semiconductor film at such a degree that each of the recesses is embedded with the third semiconductor film.

7. The method of claim 6, wherein the fourth process includes forming the third semiconductor film by supplying the semiconductor hydride gas onto the substrate while omitting the supply of the halogen-containing semiconductor gas.

8. The method of claim 6, wherein the fourth process includes, before supplying the second semiconductor raw material gas, supplying a fourth semiconductor raw material gas having an amino group onto the substrate to form a seed layer.

9. The method of claim 1, wherein the first semiconductor raw material gas is a silicon raw material gas,
the halogen-containing semiconductor gas is a halogen-containing silicon gas, and
the semiconductor hydride gas is a silane hydride gas.

10. The method of claim 9, wherein the halogen-containing silicon gas is $SiH_2Cl_2$, and the silane hydride gas is $SiH_4$.

11. The method of claim 1, wherein the halogen-containing etching gas is at least one selected from a group consisting of $Cl_2$, HCl, $F_2$, $Br_2$, and HBr.

12. The method of claim 1, wherein the insulating film is an $SiO_2$ film or an SiN film.

13. The method of claim 1, wherein the third process further includes controlling the incubation time by controlling a ratio of a flow rate of the halogen-containing semiconductor gas to a flow rate of the semiconductor hybrid gas.

* * * * *